(12) United States Patent
Humphrey et al.

(10) Patent No.: US 6,578,703 B2
(45) Date of Patent: Jun. 17, 2003

(54) MAGNETIC LATCH TRANSPORT LOADER

(75) Inventors: Henry L. Humphrey, The Colony, TX (US); Peter J. Sakakini, Frisco, TX (US); Scott A. Delmont, Pottsboro, TX (US); Michael W. Pryor, Waco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/870,357

(22) Filed: May 30, 2001

(65) Prior Publication Data
US 2002/0179412 A1 Dec. 5, 2002

(51) Int. Cl.[7] .............................................. B65G 43/00
(52) U.S. Cl. ...................................... 198/719; 198/719
(58) Field of Search ................................ 198/719, 718; 414/417, 937

(56) References Cited
U.S. PATENT DOCUMENTS 3,902,587 A * 9/1975 Checcucci ................... 198/718
4,202,440 A * 5/1980 Niki ........................... 198/718
4,387,508 A * 6/1983 Wyatt ......................... 414/417

* cited by examiner

Primary Examiner—Joseph E. Valenza
(74) Attorney, Agent, or Firm—Michael K. Skrehot; Wade James Brady III; Frederick J. Telecky, Jr.

(57) ABSTRACT

A leadframe loader having a magnetic latch of predefined strength connecting a drive arm mechanism and a pusher system is the preferred embodiment of a transport loader. The amount of force applied to a pusher blade is set to a level below that where a leadframe, or other device to be pushed would be damaged by selecting the size and strength of a magnetic latch attached to the drive arm. The magnet is designed to break away from the steel coupling structure on the pusher when the force exceeds a preset value, and stops the movement before damage to the leadframe occurs. Calculated values were verified by physical testing, and a safety margin assigned to insure release of the magnet prior to bending leadframes. The system is assimilated into different pieces of semiconductor assembly equipment.

17 Claims, 2 Drawing Sheets

MAGNETIC LATCH TRANSPORT LOADER

FIELD OF THE INVENTION

This invention relates generally to semiconductor devices, and more particularly to an equipment transport mechanism used in the assembly of semiconductor devices.

BACKGROUND OF THE INVENTION

In the fabrication of many semiconductor devices, a chip or die is mechanically and electrically connected to a leadframe prior to sealing the device in a protective package. Electrical contact is made between conductive pads on the active face of the chip and external leads of the leadframe by a thin metal wire. Several individual leadframes are formed in each leadframe strip. The strip moves as a unit through the various stages of the packaging process, and thus provides a basic component for automated assembly of packaged semiconductor devices.

In conventional packaging processes, a chip is attached to a mount or a die paddle centrally located on the leadframe by an adhesive or alloy, using automated die bonding equipment. Next, bond wires are connected between conductive bond pads on the chip and the lead fingers on the leadframe, using an automated wire bonder. The chips, bond wires, and inner lead fingers are encapsulated in plastic molding compound while the leadframes are in strip format. A trim and form operation separates the individual packaged devices on the leadframe strip, and bends the outer lead fingers into proper lead configuration.

Leadframe strips are stacked, stored, and transported between most of these operations in magazine type carriers, typically an open ended metal container having a series of parallel, horizontal protrusions or shelves inside the carrier which serve to support and separate the leadframe strips. The material is moved on various pieces of automated assembly equipment by way of carriers positioned in an elevator assembly. The elevator moves in a vertical direction to position a selected leadframe strip therein relative to a drive arm and transport blade assembly, whereby the blade assembly is aligned to a particular leadframe strip. The drive arm and blade push the leadframe strip out of the carrier to a location on the assembly equipment where a transport and indexing mechanism takes control of the strip movement. After processing, the complete leadframe strip is inserted into a second carrier on the opposite end of the transport mechanism. Alternately, with linked processing equipment, the transport mechanism continues to guide and move the strip to the next assembly operation.

Leadframes are typically etched or stamped from a thin strip of thermally and electrically conductive metal or alloy, such as a copper alloy. Most frequently, the strips are in the range of 0.004 to 0.020 inches in thickness, 0.5 to 2 inches wide, and 5 to 10 inches long. Rails on either side of the leadframe generally have a low density of patterning, and provide support, as well as the transport contact mechanism for the strip. However, owing to the thickness and low flexural strength, the strips are easily damaged by mechanical contact and force when pushed against an obstructing body.

Precise alignment of the various components in the transport stream is critical to avoid damaging to the leadframe, and destroying the semiconductor device at this late and costly stage in fabrication. It is difficult to precisely control the alignment because the carrier slots are, and must be somewhat larger than the leadframes in order to allow the material to move freely, and to allow for some expansion during the process. After positioning the carrier in line with the transport system, a leadframe strip is ejected from the carrier by a blade whose movement typically is controlled by spring or air pressure, and if the leadframe strip is not perfectly aligned with the transport mechanism, the leadframe rams the transport, and the entire leadframe strip, which in most cases will include the semiconductor chips is destroyed. It is necessary to shut down the equipment and process while an operator removes the leadframe. This is frequently a time consuming operation if the frame is entangled with the transport mechanism.

It would be a significant advantage to the industry if a means of avoiding damage to leadframes caused by imprecise alignment to transport mechanism could be avoided.

SUMMARY OF THE INVENTION

It is an object of the invention to provide a means to materially reduce or eliminate damage to leadframe strips caused by misalignment to the transport system.

It is an object of the invention to minimize semiconductor assembly equipment down time by avoiding entanglement of leadframes with transport mechanisms.

It is an object of the invention to provide an inexpensive modification to existing leadframe loading system drive arm and blade assemblages.

It is further an objective of the invention to provide a means for rapid set-up of the drive arm and push blade mechanism, relative to existing leadframe loading systems.

It is an object of the invention to provide a system whereby the amount of force applied to the blade is predetermined, and is adjustable as a function of the strength of the material being moved.

It is an object of the invention to provide a leadframe loading system for a wire bonder, a die bond curing system, a mold loader, a trim and form transport, and/or an integrated assembly system.

It is an object of the invention to provide a magnetic drive loader for trays carrying flex film in strip format.

It is an object of the invention to provide a horizontal push system having a magnetic latch.

The above and other objectives will be met by setting the amount of force applied to a pusher blade to a level below that whereby a leadframe, or other device to be pushed will be damaged, and limiting the amount of force by the size and strength of a magnetic latch attached to the drive arm. The magnet is designed to break away from the steel drive arm when force exceeds a preset value, and stops the material movement before damage to the leadframe occurs. The failure is detected by the assembly equipment computer.

The preset value is determined from the material characteristics of the leadframe, and size and strength of the magnet. Calculated values were verified by physical testing, and a safety margin assigned to insure release of the magnet prior to bending leadframes.

DETAILED DESCRIPTION OF THE INVENTION

Figure 1:
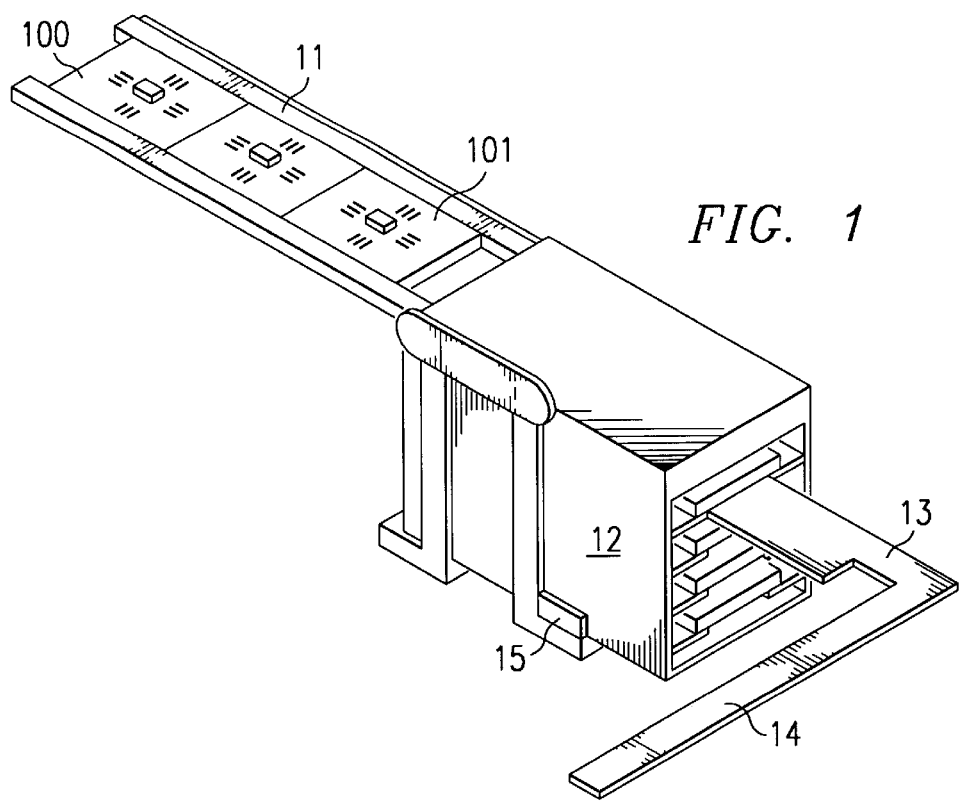
FIG. 1 illustrates leadframes correctly positioned on a transport track.

FIG. 1 is a leadframe loader system wherein the leadframes are pushed from a magazine type carrier onto a track. This type of loader system is used for moving a leadframe onto the work stage of various pieces of automated semiconductor packaging assembly equipment. Leadframe 100 is positioned in transport track 11 having slots to guide and control the location of the leadframe during a given assembly process. A second leadframe 101 is being pushed horizontally from a slotted carrier 12 by a blade 13 connected to a drive arm 14. An elevator assembly 15 moves the carrier 12 vertically so that the leadframe is parallel to the track before the drive arm and blade mechanism is engaged.

Figure 2:
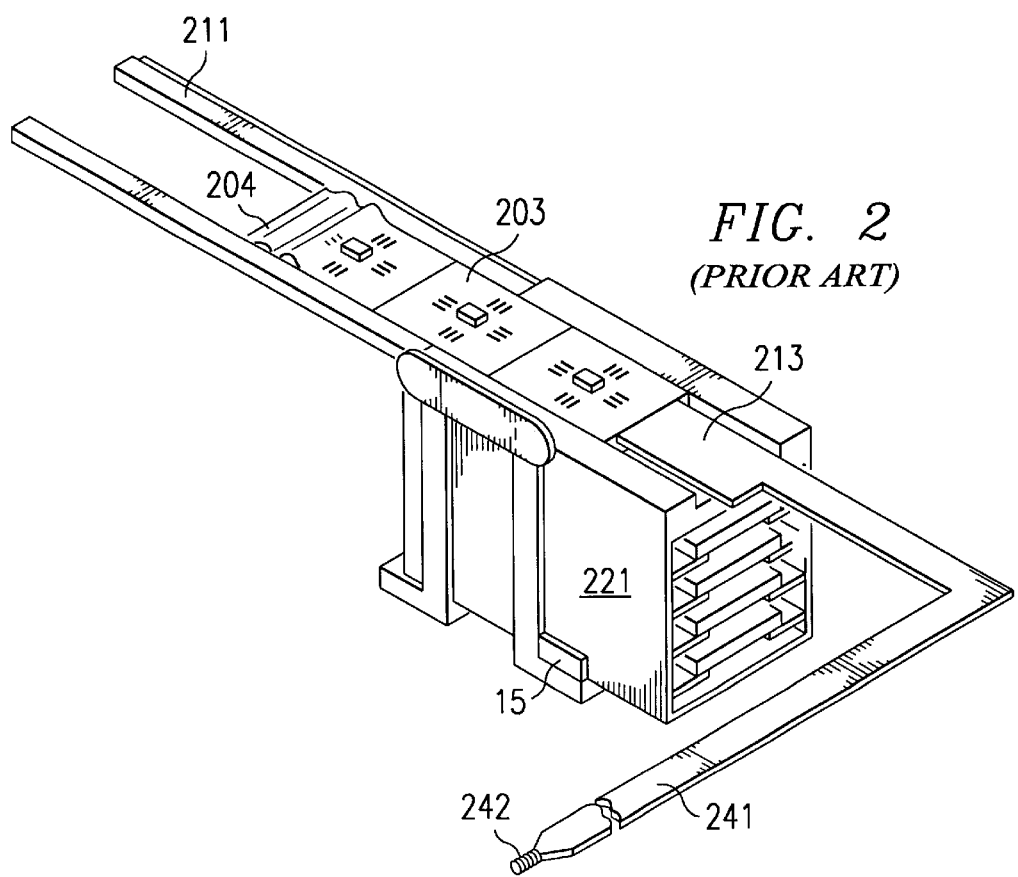
FIG. 2 illustrates a leadframe mis-aligned with a track resulting in failure. (Prior art)

FIG. 2 provides a cutaway view of a magazine type carrier 221 wherein a leadframe 203 is being pushed by a blade 213 connected to a drive arm 241 of current technology, wherein a spring 242 provides the force. In this example, the leadframe 203 is slightly mis-aligned with respect to guides in the track 211. Force on the spring 242 is maintained as the leadframe comes into contact with the transport system, and the thin metal leadframe, being the weakest member in the train, is distorted at point 204 as it is pushed against the track 211. A bent leadframe is often jammed into or under the track guides, causing the assembly equipment and process to be stopped while the leadframe is manually removed.

Figure 3:
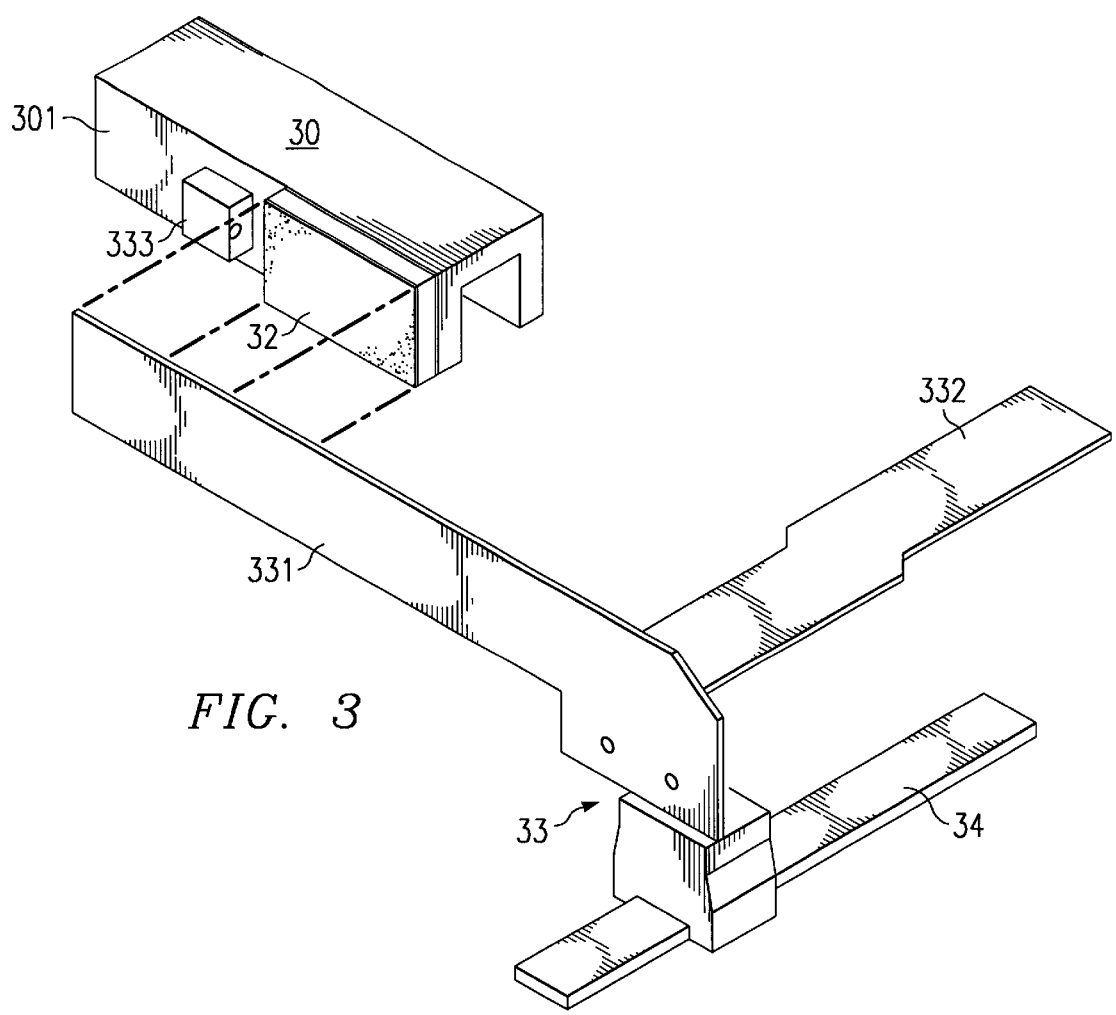
FIG. 3 illustrates the preferred embodiment of the invention as a magnetic leadframe loader.

FIG. 3 is a magnetically coupled drive arm/blade transport loader system of the current invention. A motor driven arm 30 is connected to a steel coupling on a pusher blade assembly 33 by a magnetic latch 32 having a predefined release strength. The maximum amount of force on the pusher blade is determined by the size and strength of the magnetic latch 32, and is set to a level below that where damage to the material being moved would occur.

In a preferred embodiment, the magnetically coupled loader system is a leadframe loader, wherein the loader system is included in a piece of equipment used in the fabrication of semiconductor packages, and functions to move leadframes from a carrier to a transport system or work station. The current system is consistent with existing leadframe loader assemblages in that a pusher blade slides horizontally on a slide assembly 34, and motion of the drive arm is controlled by a motor (not shown). However, in the current invention, the maximum amount of force on the blade is selected by the size and strength of the magnet 32, and is set to a level below that where damage to the leadframe would occur. There is no spring loading, or air pressure to force leadframe movement, as is found with existing systems.

Operation of the system is as follows; a drive arm 30 having a vertical face 301 with an attached magnetic pad 32 of predetermined size and strength is energized by a motor. The magnet 32 couples the drive arm 30 to a steel coupling structure 331 of the blade assembly which includes a blade 332 attached at approximately a 90 degree angle. The drive arm 30 forces the coupled blade system 33 to move on the slide assembly 34, and subsequently to contact and push a leadframe to a desired location. If interference is encountered by the object being moved, and the strength of the magnetic latch is exceeded, the magnet releases from the blade coupling structure, thereby disconnecting the drive arm from the blade so that leadframe movement is stopped prior to incurring damage. Any further movement of the drive arm is independent of the blade assembly, thus eliminating damage to the object which encountered the interference. Disconnection between the drive arm and blade assembly is detected by a sensor (not shown), and is communicated to a computer system of the semiconductor assembly equipment.

In the preferred embodiment, the drive arm 30 is a metallic structure having a vertical face 301 approximately 0.65 inches wide with a magnetic pad 32 attached to the exposed vertical face. Preferably, the drive arm is made of a sturdy, but lightweight material, such as an aluminum alloy.

The size of the magnetic pad affixed to the arm is preselected to avoid damage to the leadframe in work, and therefore the magnetic strength is based on material properties of the leadframe, such as size and flexural strength. In a preferred embodiment, selected for use with leadframes of copper alloys, in the range of 1 to 3 inches wide, and 0.004 to 0.01 inches thick, the magnetic pad 32 is about 1.0 inch long, 0.35 inches wide, and about 0.06 inches thick, and has maximum pull of 18 pounds pull per foot.

The magnetic catch coupling 331 on the blade system includes a vertically oriented steel member about 2.25 inches long by about 0.65 inches high connected to a steel push blade 332. The blade is about 3.2 inches long, about 0.1 inch thick and about 0.6 inches wide.

Figure 4:
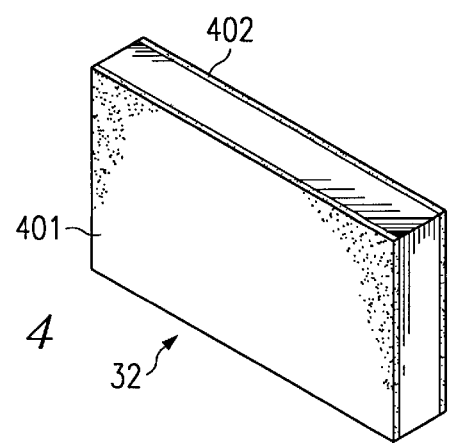
FIG. 4 is a magnetic pad having a ferrite on one surface and an adhesive on the second surface.

In the preferred embodiment, the magnetic latch pad, shown in FIG. 4 is a thin flexible material, having a ferrite embedded in a plastic binder on the first surface 401, and a pressure sensitive adhesive on the second surface 402. The size of the magnetic pad to be used for release at a given pull force is determined from the magnetic strength a particular thickness of pad, and the length and width dimensions. The magnetic pad of the preferred embodiment, allowing a safety factor for copper leadframe flexural strength, has a magnetic strength of 18 pounds pull per foot. Pad dimensions for the preferred embodiment were calculated to allow separation at about 250 grams force, a force which provides a margin of safety for avoiding damage to copper leadframes. The loader system was physically tested to assure accuracy of the calculations and the magnetic strength.

The magnetic pad is secured to the vertical face of the drive arm 301 by a pressure sensitive adhesive. Such magnetic materials are available from Bunting Magnetics Company, 500 S. Spencer Avenue, Newton, Kans. 67114. Variations in thickness, size and magnetic patterns and strength are available for alternate embodiments.

In one embodiment, the magnetic latch loader system is integrated into the transport mechanism on a wire bonder. Electronic controls and detectors for movement of the leadframe are a function of the computer and software of the bonder.

In an alternate embodiment, the magnetic latch loader is a part of and is attached to a trim and form equipment material movement system. In yet another embodiment, the magnetic latch loader of this invention is attached to and is a part of an inline die mount curing system's material movement process. In yet another embodiment, the loader of this invention is attached to and is a part of the material movement for a molding and encapsulation process for semiconductor packages. Further embodiments of the magnetic latch system include one or more loader systems in an automated inline assembly process equipment. Another embodiment having connection to semiconductor packaging is a tray loader carrying flex film supported devices, wherein the material to be moved is supported by a tray, not a leadframe, and the size and strength of the latch are significantly different from the system for leadframe loading.

The steel magnetic coupling member is protected by a thin nickel plating for applications of the magnetic latch load system wherein heat or other oxidizing conditions may be encountered.

In yet other embodiments, the drive arm is parallel to the blade and slid assembly, and the magnetic strength is based on the peel strength of the magnet, rather than pull strength.

The magnetic latch load system of the current invention is a multipurpose transport loader system, particularly applicable to lateral movement of fragile components. The system includes a drive arm and a pusher assemblage coupled by a magnetic latch of selected strength.

Advantages of the magnetic latch leadframe loader have been demonstrated in the shorter set-up time for aligning loader to transport, in lower process down time due to lack of jammed leadframes, and the ability to recover rapidly from mis-alignment, and in the decrease in cost of material scrapped during the assembly process. Further, the magnetic latch system is a low cost modification to existing loader systems, and is applicable to a number of different semiconductor assembly processes.

The afore mentioned embodiments of a magnetic latch loader are related to specific semiconductor device assembly applications, but the magnetic latch loading system is in no way limited to this application, but instead many variations and modifications will immediately become apparent to those skilled in the art. It is therefore the intention that the appended claims be interpreted as broadly as possible in view of the prior art to include all such variations and modifications.

What is claimed is:

1. A transport loader system including:
   a) a motor driven arm having a vertical face;
   b) a pusher assemblage having a vertical coupling component and a horizontal blade; and
   c) a magnetic latch attached to said drive arm and connected to said pusher assemblage.

2. A transport loader system as in claim 1 wherein said magnetic latch is a flexible pad having two major surfaces, the first surface comprising a ferrite in a thermoplastic binder, and the second surface, comprising an adhesive.

3. A transport loader system as in claim 1 wherein the magnetic strength of said latch is related to the pad size and pull strength.

4. A leadframe loader system including a magnetic latch attached to a drive system, and a blade assemblage releasably coupled to said magnetic latch on said drive system.

5. A leadframe loader system as in claim 4 wherein said magnetic latch is adhered to the vertical face of a drive arm on said drive system.

6. A leadframe loader system as in claim 4 wherein said blade assemblage includes a blade attached to a coupling component at approximately a 90 degree angle, said coupling component releasably coupled to said magnetic latch on said drive system.

7. A leadframe loader system as in claim 4 wherein the maximum strength of said magnetic latch is less than the flexural strength of a leadframe strip to be moved by said leadframe loader system.

8. A leadframe loader system as in claim 4 wherein said coupling component includes a nickel coating.

9. A leadframe loader system as in claim 4 wherein said magnetic pad is about 1 inch long, 0.06 inches thick, and about 0.35 inches wide.

10. A transport loader system as in claim 1 wherein disconnection between said drive arm and said pusher assemblage at said magnetic latch is detected by a sensor.

11. A transport loader system, comprising:
   a drive arm;
   a coupling component releasably attached to said drive arm with a magnetic latch of a predetermined strength; and
   a pusher attached to said coupling component, wherein said magnetic latch is operable to release said coupling component from said drive arm in the event said pusher imposes a force on said coupling component in excess of said predetermined strength of said magnetic latch.

12. The transport loader system of claim 11, wherein said coupling component is releasably attached to said drive arm such that, upon release, said coupling component pulls away at approximately a 90 degree angle from said drive arm.

13. The transport loader system of claim 11, wherein said drive arm is arranged in parallel to said pusher such that, upon release, said coupling component peels away from said magnetic latch.

14. The transport loader system of claim 11, wherein said magnetic latch is a flexible pad having two major surfaces, the first surface comprising a ferrite in a thermoplastic binder, and the second surface comprising an adhesive.

15. The transport loader system of claim 11, further comprising a slide assembly, wherein said pusher is slidably attached to said slide assembly.

16. The transport loader system of claim 11, further comprising a carrier, wherein said pusher is operable to engage said carrier and to push an object from said carrier to a desired location.

17. The transport loader system of claim 16, wherein said object is a leadframe.

* * * * *